US010600914B2

(12) United States Patent
Zhao et al.

(10) Patent No.: US 10,600,914 B2
(45) Date of Patent: Mar. 24, 2020

(54) ISOLATION PILLAR FIRST GATE STRUCTURES AND METHODS OF FORMING SAME

(71) Applicant: GLOBALFOUNDRIES INC., Grand Cayman (KY)

(72) Inventors: Wei Zhao, Fort Lee, NJ (US); Ming Hao Tang, Ballston Lake, NY (US); Haiting Wang, Clifton Park, NY (US); Rui Chen, Clifton Park, NY (US); Yuping Ren, Clifton Park, NY (US); Hui Zang, Guilderland, NY (US); Scott H. Beasor, Greenwich, NY (US); Ruilong Xie, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 50 days.

(21) Appl. No.: 15/869,541

(22) Filed: Jan. 12, 2018

(65) Prior Publication Data

US 2019/0221661 A1 Jul. 18, 2019

(51) Int. Cl.
*H01L 29/78* (2006.01)
*H01L 21/762* (2006.01)
*H01L 21/265* (2006.01)
*H01L 21/28* (2006.01)
*H01L 21/3105* (2006.01)

(Continued)

(52) U.S. Cl.
CPC ...... *H01L 29/785* (2013.01); *H01L 21/26513* (2013.01); *H01L 21/28247* (2013.01); *H01L 21/31053* (2013.01); *H01L 21/76229* (2013.01); *H01L 21/76283* (2013.01); *H01L 27/1104* (2013.01); *H01L 29/4238* (2013.01); *H01L 29/4958* (2013.01); *H01L 29/4966* (2013.01); *H01L 29/66545* (2013.01); *H01L 29/66795* (2013.01)

(58) Field of Classification Search
None
See application file for complete search history.

(56) References Cited

U.S. PATENT DOCUMENTS 9,064,932 B1   6/2015 Pham et al.
9,281,382 B2 * 3/2016 Liu ................... H01L 29/66795
(Continued)

FOREIGN PATENT DOCUMENTS

TW   201521120 A   6/2015

*Primary Examiner* — Anthony Ho
*Assistant Examiner* — Kevin Quinto
(74) *Attorney, Agent, or Firm* — Francois Pagette; Hoffman Warnick LLC

(57) ABSTRACT

A method of forming isolation pillars for a gate structure, the method including: providing a preliminary structure including a substrate having a plurality of fins thereon, an STI formed between adjacent fins, an upper surface of the STIs extending higher than an upper surface of the fins, and a hardmask over the upper surface of the fins and between adjacent STIs; forming a first trench in a first selected STI and between adjacent fins in a gate region, and forming a second trench in a second selected STI and between adjacent fins in a TS region; and filling the first and second trenches with an isolation fill thereby forming a first isolation pillar in the gate region and a second isolation pillar in the TS region, the first and second isolation pillars extending below the upper surface of the STIs.

19 Claims, 9 Drawing Sheets a b

(51) Int. Cl.
 *H01L 27/11* (2006.01)
 *H01L 29/423* (2006.01)
 *H01L 29/49* (2006.01)
 *H01L 29/66* (2006.01)

(56) References Cited

U.S. PATENT DOCUMENTS

| | | |
|---|---|---|
| 9,373,641 B2 | 6/2016 | Anderson et al. |
| 9,608,086 B2 | 3/2017 | Wei et al. |
| 9,859,364 B1 | 1/2018 | Wang et al. |
| 2009/0020783 A1* | 1/2009 | Zhang ............... H01L 29/165 257/190 |
| 2015/0200252 A1* | 7/2015 | Ching ............... H01L 29/0649 257/510 |
| 2015/0357439 A1 | 12/2015 | Liu et al. |
| 2016/0126086 A1 | 5/2016 | Cheng et al. |
| 2016/0197072 A1 | 7/2016 | Liu et al. |
| 2016/0372383 A1* | 12/2016 | Basker ............... H01L 21/845 |

* cited by examiner

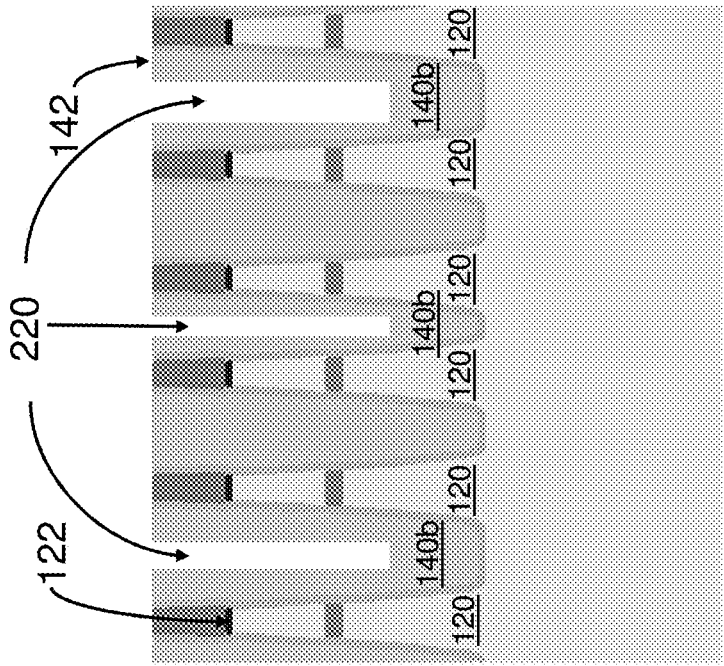
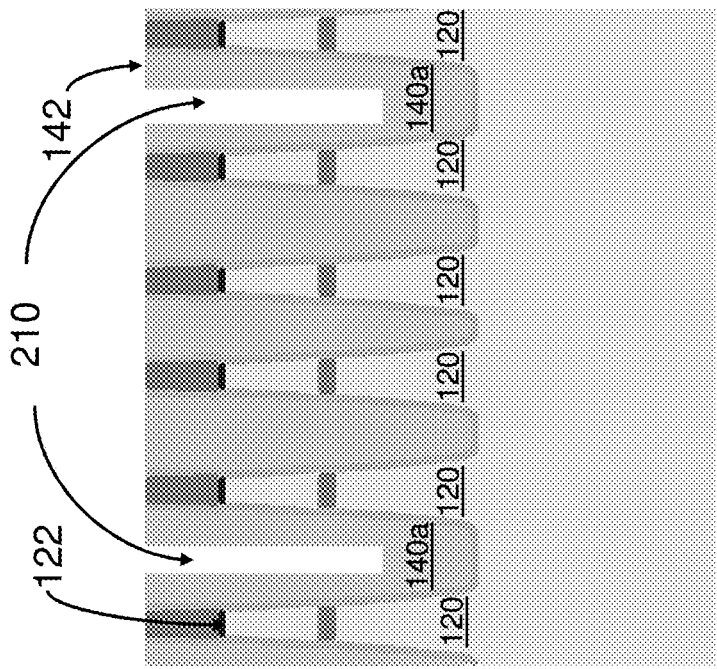
FIG. 2

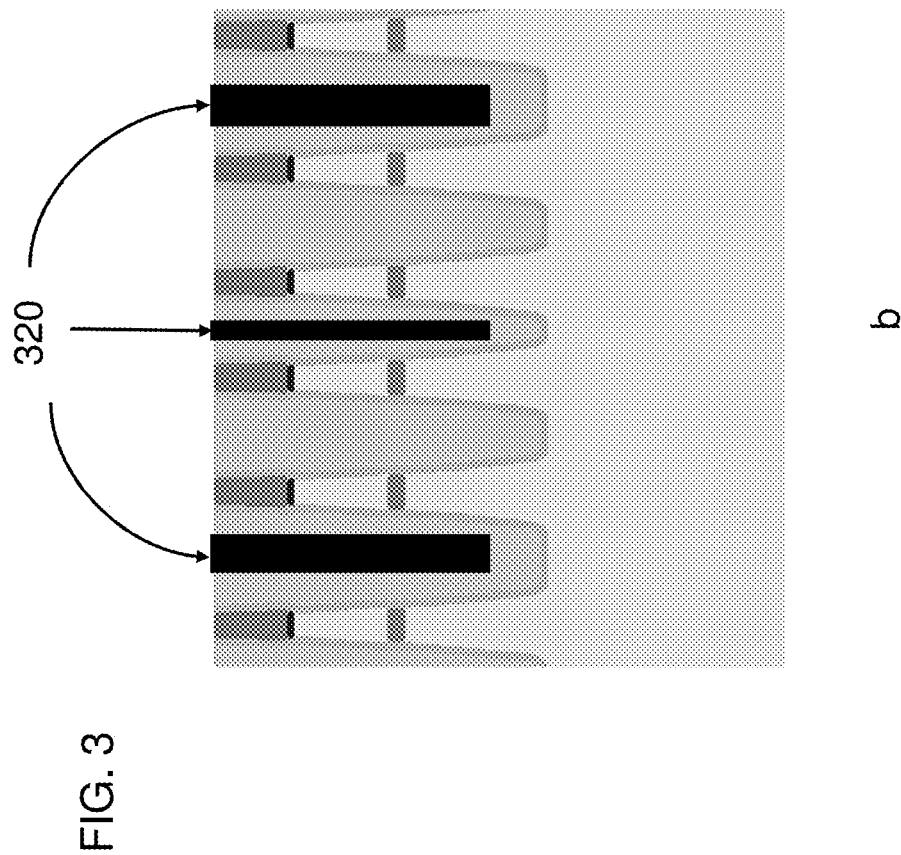
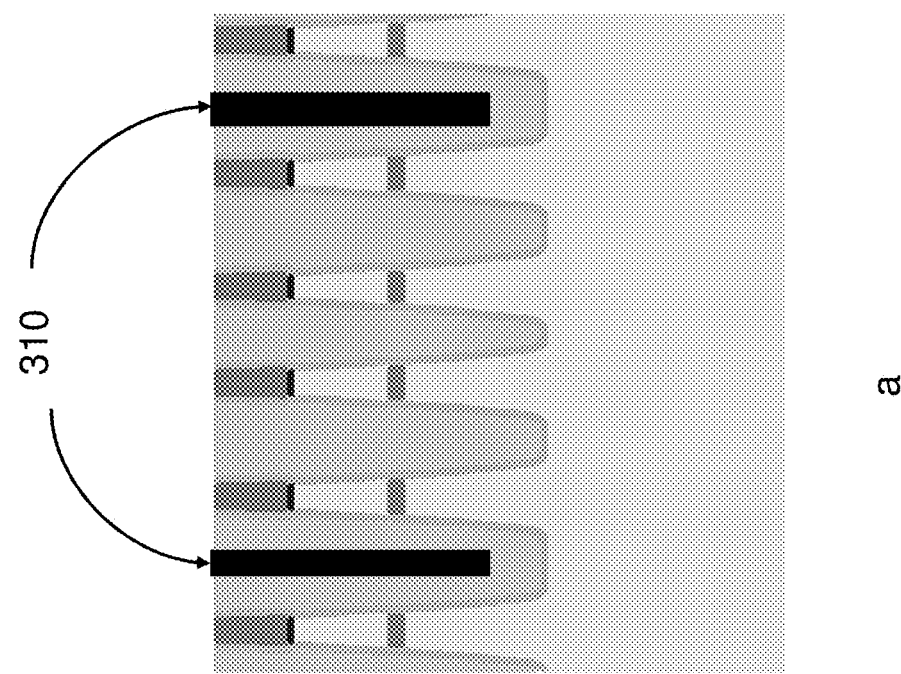
FIG. 3

FIG. 4
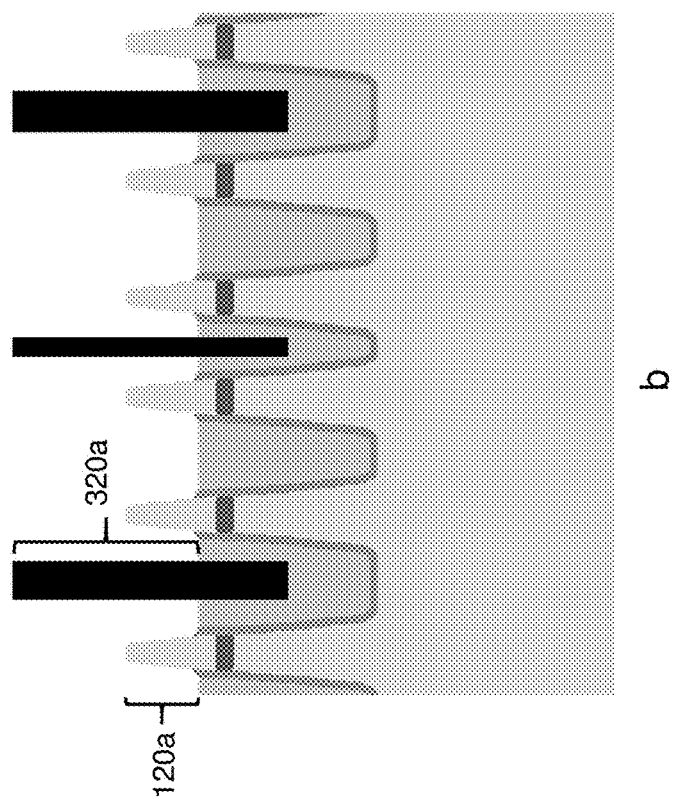
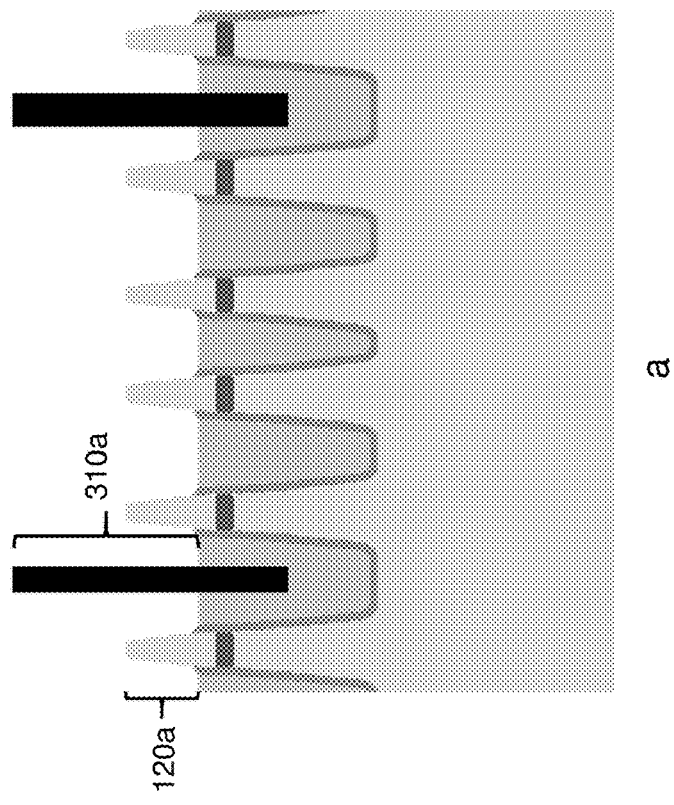

FIG. 5
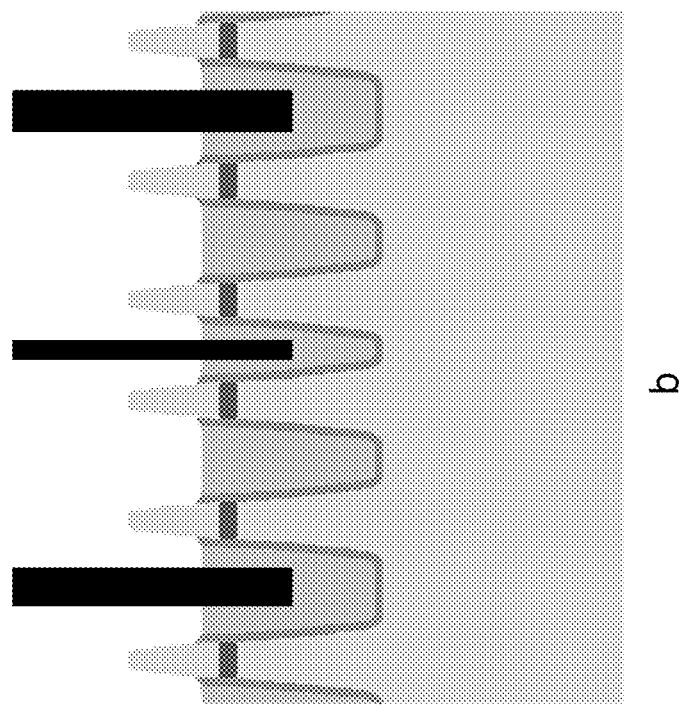
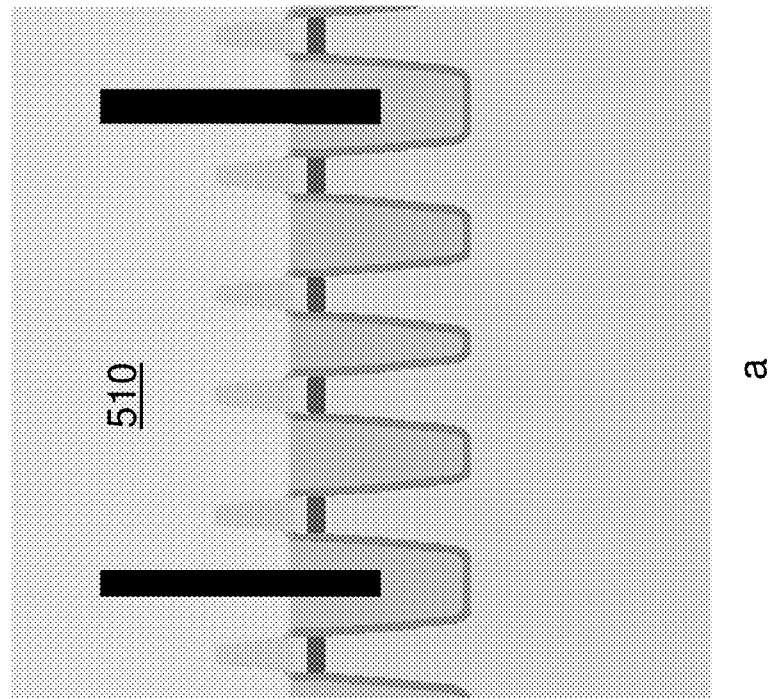

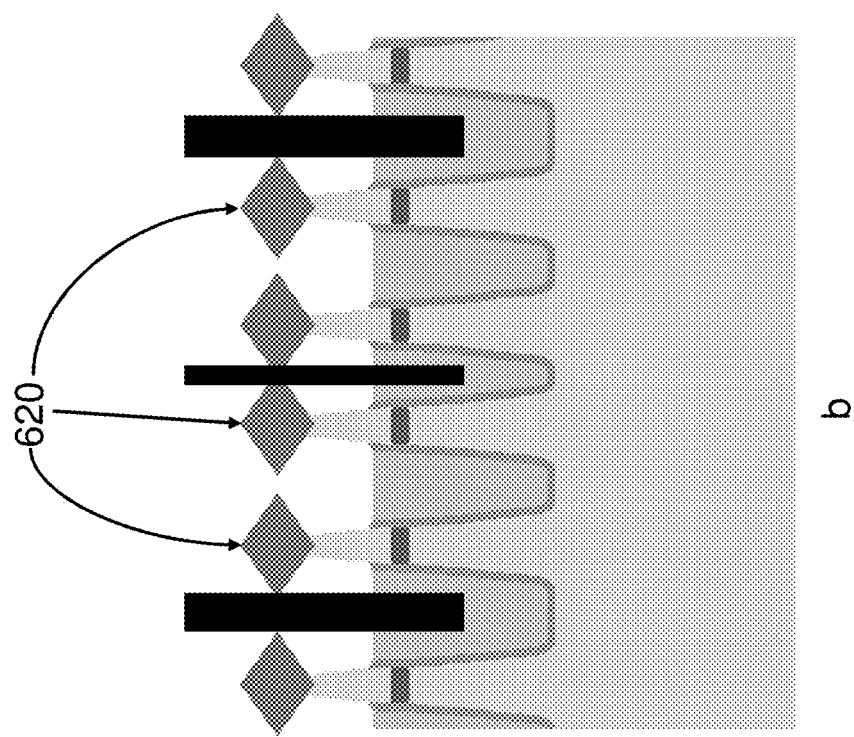
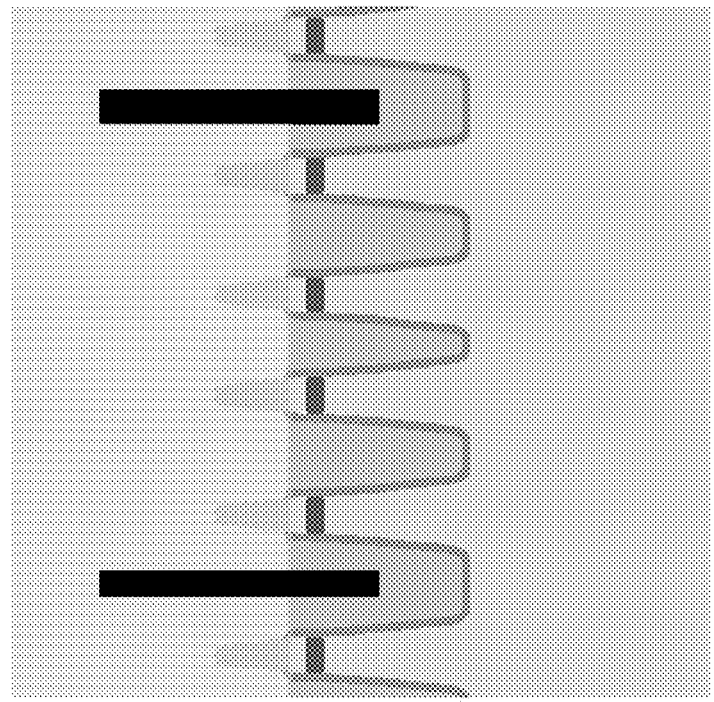
FIG. 6

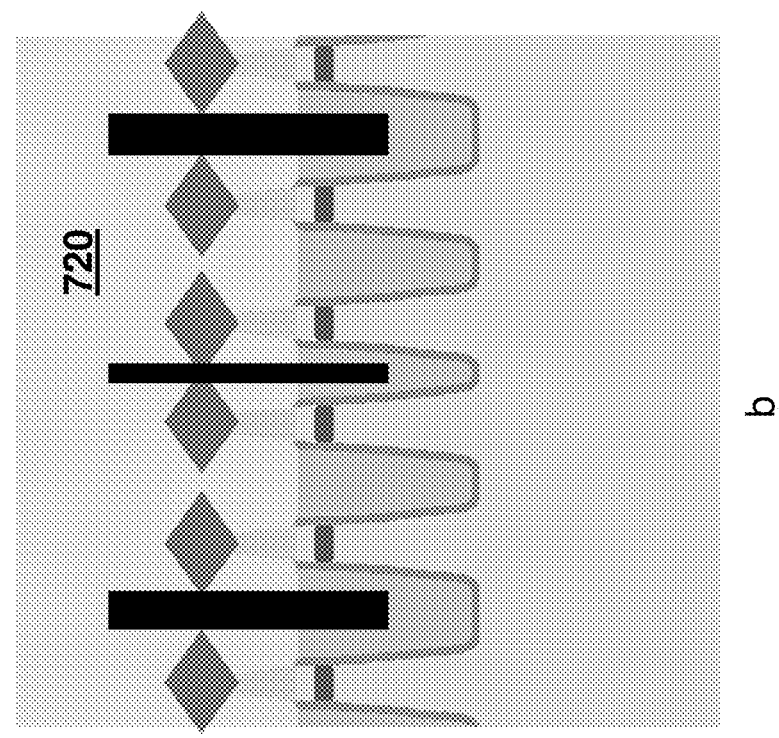
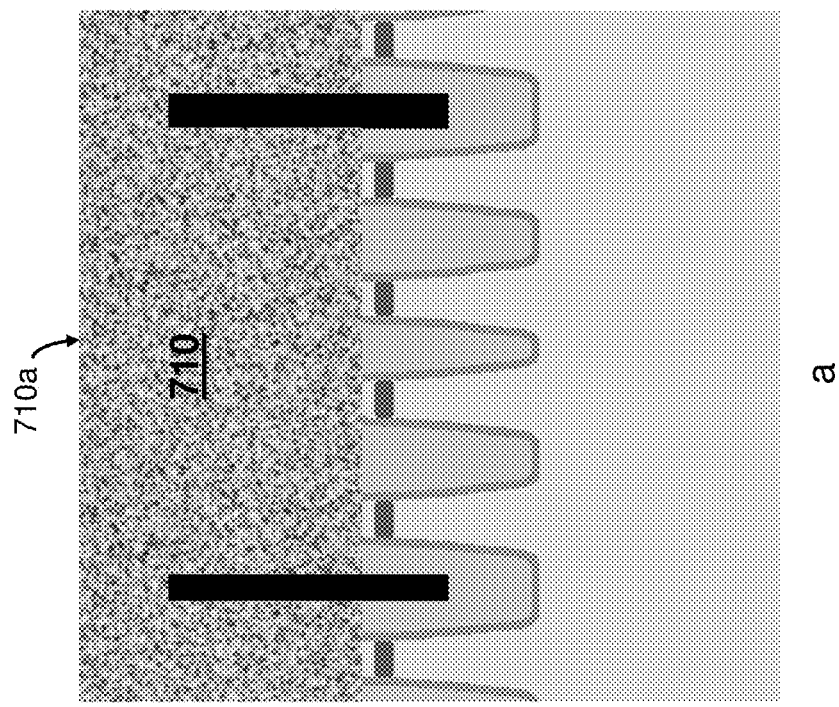
FIG. 7

FIG. 8
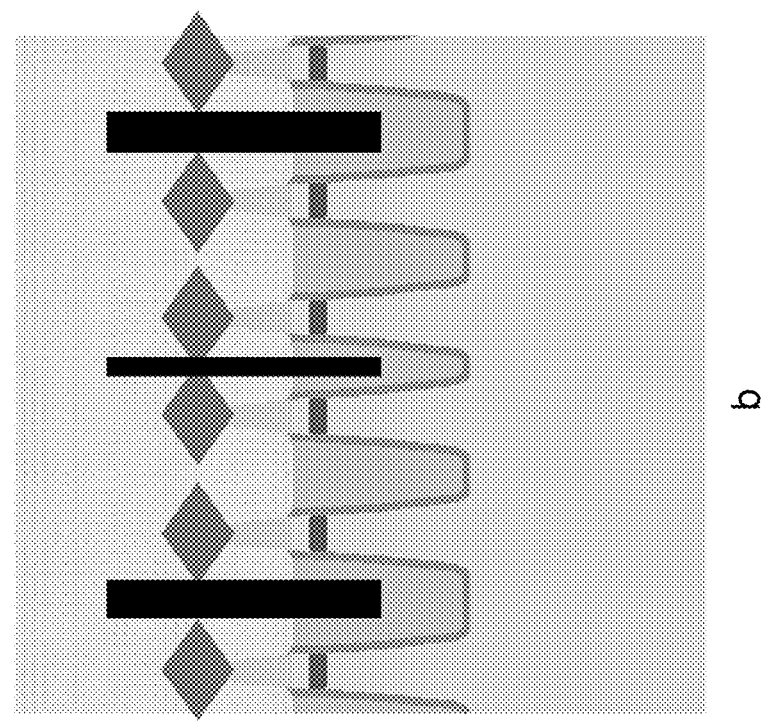
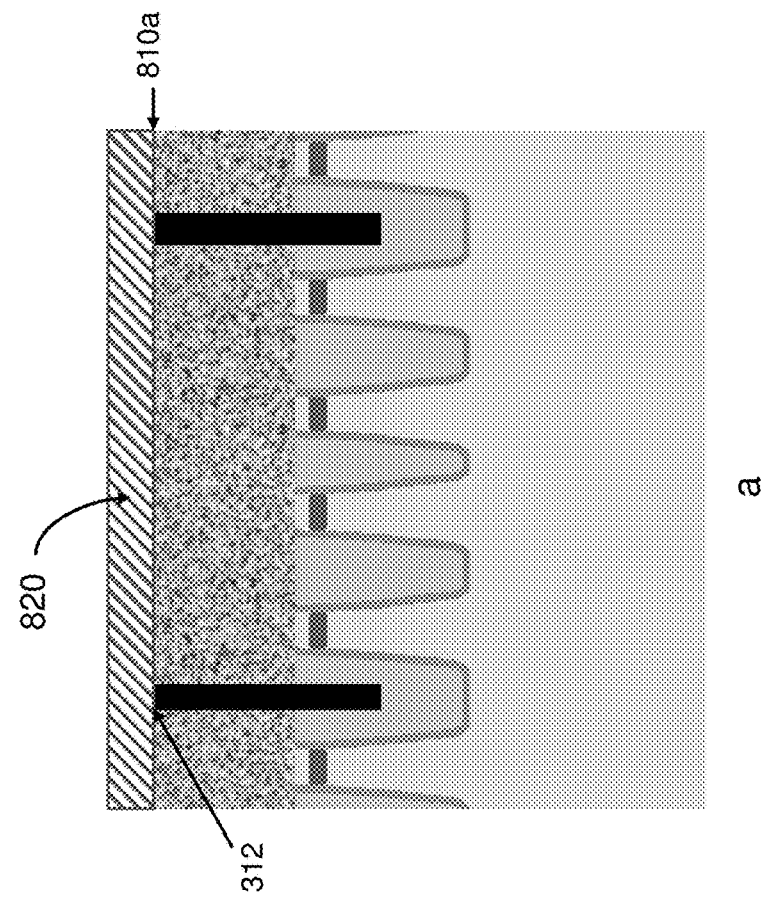

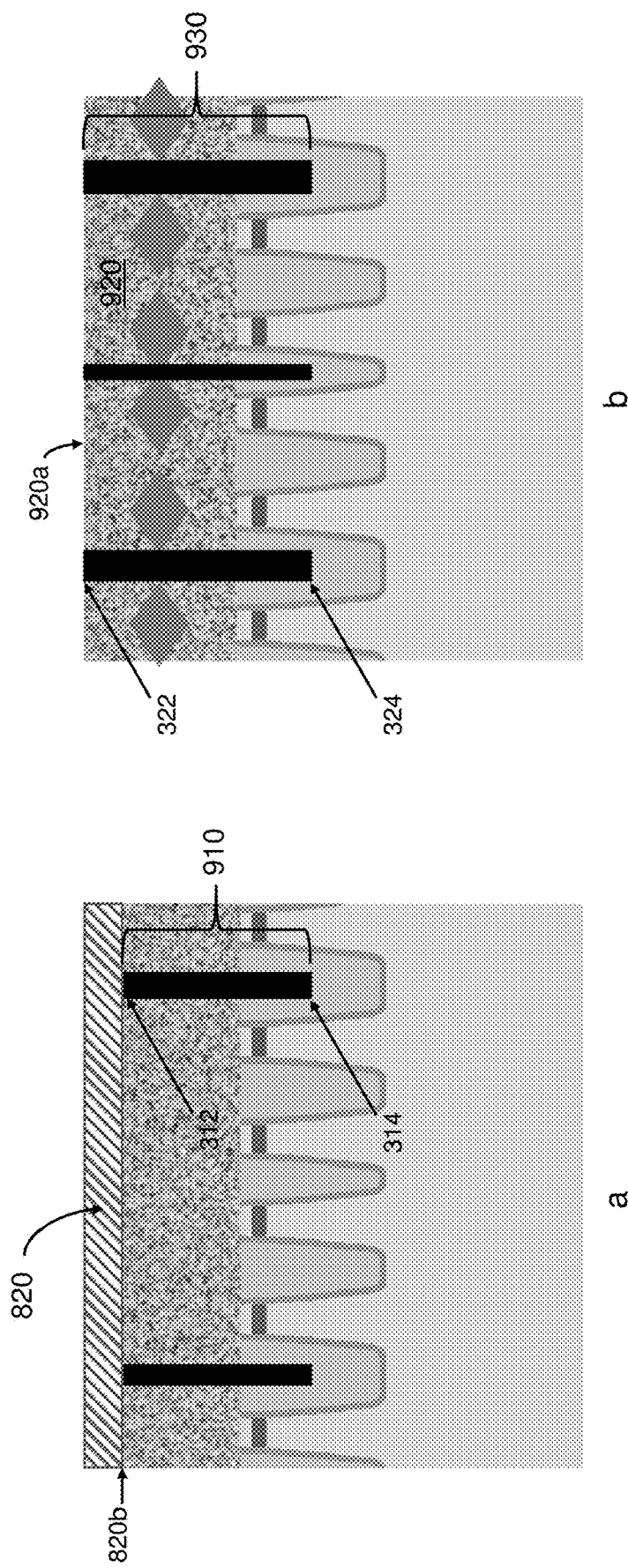

US 10,600,914 B2

ISOLATION PILLAR FIRST GATE STRUCTURES AND METHODS OF FORMING SAME

TECHNICAL FIELD

The subject matter disclosed herein relates generally to isolation pillar formation in gate structures for use in a semiconductor device such as an integrated circuit (IC), and more particularly, to isolation pillar first (before dummy gate) gate structures and methods of forming the same.

BACKGROUND

Integrated circuit (IC) chips are formed on semiconductor wafers at increasingly smaller scale. In current technology nodes, such as 7, 10 and 14 nanometer technologies, transistor devices are constructed as three-dimensional (3D) fin field effect transistor (FINFET) structures. The fins of the FINFETs are typically constructed as repeating, equally spaced, vertical structures on the wafer. Equally spaced gates are formed as repeating vertical structures that overlay the fins in an orthogonal direction.

A challenge in constructing the repeating structures such as fins and gates at, for instance, the 7 nanometer technology node, is the need for a larger/taller gate budget (e.g., 110 nm) as compared to previous technology nodes (e.g., 60 nm for 14LP) due to significant gate height loss during processing (e.g., >60 nm loss). However, such an increase in the gate budget (i.e., processing layer thicknesses) to combat gate height loss creates a new problem, namely high aspect ratios for trenching/cutting during processing. A method of forming a 7LP gate structure utilizing a smaller gate budget and having reduced aspect ratios is needed.

In addition, the 7 nanometer technology node typically suffers from "epi merge" (merging of epitaxially grown structures) when epitaxial films are deposited on the fins during subsequent processing due to decreased (and potentially unequal) spacing between fins. Thus, a method of forming a 7LP gate structure that avoids epi merge and therefore provides improved device performance is also needed.

BRIEF SUMMARY

Methods of forming isolation pillars for a gate structure for use in a semiconductor device such as an integrated circuit are disclosed. In a first aspect of the disclosure, a method of forming isolation pillars for a gate structure includes: providing a preliminary structure, the preliminary structure including a substrate having a plurality of fins thereon, a shallow trench isolation (STI) formed between adjacent fins, an upper surface of the STIs extending higher than an upper surface of the plurality of fins, and a hardmask over the upper surface of the plurality of fins and between adjacent STIs; forming a first trench in a first selected STI in a gate region of the plurality of fins and a second trench in a second selected STI in a trench silicide (TS) region of the plurality of fins, the first trench being formed between adjacent fins in the gate region and the second trench being formed between adjacent fins in the TS region; and filling the first and second trenches with an isolation fill, the filling of the first trench forming a first isolation pillar in the gate region and the filling of the second trench forming a second isolation pillar in the TS region, the first and second isolation pillars extending below the upper surface of the STIs.

In a second aspect of the disclosure, an isolation pillar containing gate structure includes: a structure comprising a substrate having a plurality of fins thereon, a shallow trench isolation (STI) formed between adjacent fins, an upper surface of the STIs being below an upper surface of the plurality of fins; a metal gate formed over a top portion of the plurality of fins and the upper surface of the STIs in a gate region of the structure; a first isolation pillar in the gate region extending through the metal gate and into a first selected STI in the gate region; an epitaxial diamond junction on the top portion of the plurality of fins in a trench silicide (TS) region of the structure; a metal layer formed over a top surface of the diamond junctions and the upper surface of the STIs in the TS region; and a second isolation pillar in the TS region extending through the metal layer, between adjacent diamond junctions and into a second selected STI in the TS region.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure.

FIG. 2 shows formation of a first trench in a gate region of the structure and a second trench in a trench silicide (TS) region of the structure.

In FIG. 2 through FIG. 9, the gate region cross-section of the structure is labelled cross-section "a" and the TS region cross-section of the structure is labelled cross-section "b".

FIG. 3 shows formation of a first isolation pillar and a second isolation pillar in the first and second trenches respectively.

FIG. 4 shows removal of a hardmask and partial removal of shallow trench isolations (STIs) formed between adjacent fins of the structure, thereby resulting in a reveal of top portions of the first and second isolation pillars as well as top portions of the fins.

FIG. 5 shows dummy gate formation in the gate region only (cross-section "b" remains unchanged).

FIG. 6 shows source/drain formation in the TS region only (cross-section "a" remains unchanged).

FIG. 7 shows metal gate replacement in the gate region and TS region masking.

FIG. 8 shows metal gate recessing followed by capping in the gate region only (cross-section "b" remains unchanged).

FIG. 9 shows mask removal and metal layer formation in the TS region only (cross-section "a" remains unchanged).

Figure 1:
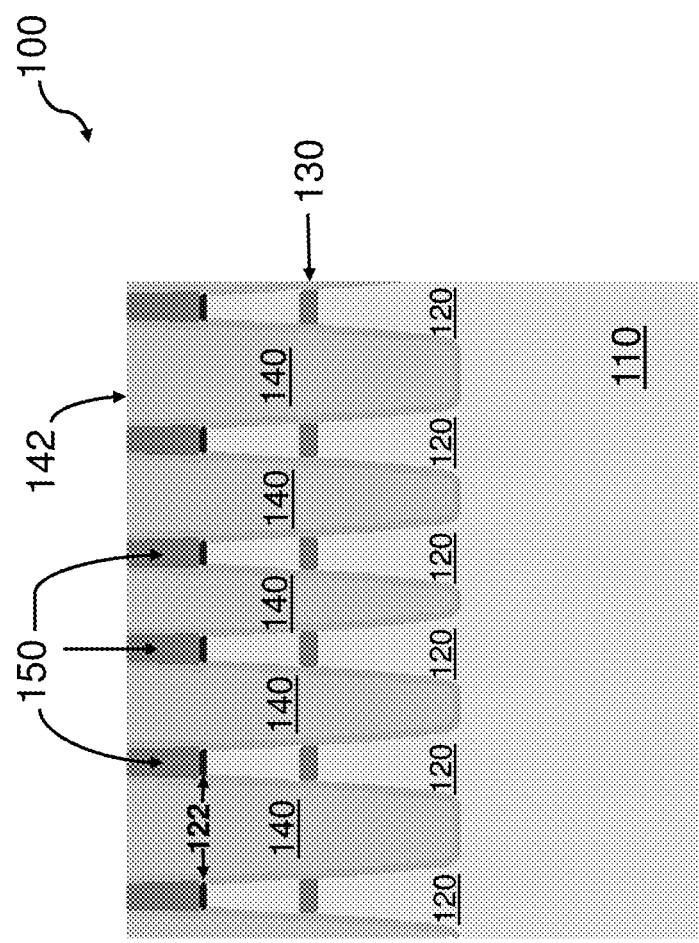
FIG. 1 shows a cross-section of a preliminary structure used as a starting point for the disclosed methods of forming isolation pillars for a gate structure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

Detailed embodiments of the claimed structures and methods are disclosed herein; however, it can be understood that the disclosed embodiments are merely illustrative of the claimed structures and methods that may be embodied in various forms. The subject matter of this disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art.

In the interest of not obscuring the presentation of embodiments of the present disclosure, in the following detailed description, some processing steps or operations that are known in the art may have been combined together for presentation and for illustration purposes and in some instances, may have not been described in detail. In other instances, some processing steps or operations that are known in the art may not be described at all. It should be understood that the following description is rather focused on the distinctive features or elements of various embodiments of the present disclosure.

The present disclosure relates generally to isolation pillar formation in gate structures for use in a semiconductor device such as an integrated circuit (IC), and more particularly, to isolation pillar first (before dummy gate) gate structures and methods of forming the same. As mentioned above, advancement to the 7 nanometer technology node has the disadvantages of needing large gate budgets, trenching/cutting under high aspect ratio conditions, and having to address epi merge problems. Methods of forming isolation pillars for a gate structure for use in a semiconductor device wherein the methods allow for reduced gate budgets, lower aspect ratios and epi separation are described below and with reference to the Figures.

FIG. 1 illustrates a preliminary structure 100 (in cross-section) used as a starting point for the disclosed methods of forming isolation pillars for a gate structure. Preliminary structure 100 includes a substrate 110 having a plurality of fins 120 thereon. Substrate 110 can be composed of any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Similar to substrate 110, fins 120 can be composed of any currently known or later developed semiconductor material and fins 120 can be composed of the same or different material as that of substrate 110. Fins 120 can optionally contain an isolation layer 130 therein. Isolation layer 130 can be composed of an isolation material including, but not limited to, $SiO_2$ and SiN.

Preliminary structure 100 also includes a shallow trench isolation (STI) 140 formed between adjacent fins 120. STIs 140 can be composed of a dielectric material or a combination of dielectric materials, such as, but not limited to, SiN and $SiO_2$. STIs 140 may have an upper surface 142 that extends higher than an upper surface 122 of fins 120. Preliminary structure 100 further includes a hardmask 150 formed on upper surface 122 of fins 120 and between adjacent STIs 140. Hardmask 150 may be comprised of any one or more of a variety of different insulative materials, such as $Si_3N_4$, SiBCN, SiNC, SiN, SiCO, $SiO_2$ and SiNOC.

FIG. 2 illustrates formation of first and second trenches 210, 220 in a gate region (cross-section "a") of structure 100 and a trench silicide (TS) region (cross-section "b") of structure 100 respectively. Cross-section "a" and cross-section "b" of structure 100, as shown in FIG. 2 through FIG. 9, differ in that they are cross-sections at differing locations of structure 100 as one moves into and out of the page of FIG. 1. More specifically, cross-section "a" is located within structure 100 where a gate structure will be subsequently formed (later discussed) and cross-section "b" is located within structure 100 where source/drain structures will be subsequently formed (later discussed).

A first trench 210 is formed in a first selected STI 140a in a gate region of structure 100 (cross-section "a"). Multiple first trenches 210 may be formed in multiple selected STIs 140a in the gate region of structure 100. Any combination of STIs 140a is foreseen. For illustration purposes only, two first trenches 210 are depicted in FIG. 2; however, more or less trenches 210 may be present. For illustration purposes only, the two first trenches 210 are depicted in FIG. 2 as being formed in the left-most STI 140a and the right-most STI 140a; however, such a configuration may be altered to utilize any combination of STIs 140a. First trench(es) 210 is/are formed between adjacent fins 120 and extend below top surface 142 of STIs 140a and below top surface 122 of fins 120.

A second trench 220 is formed in a second selected STI 140b in a TS region of structure 100 (cross-section "b"). Multiple second trenches 220 may be formed in multiple selected STIs 140b in the TS region of structure 100. Any combination of STIs 140b is foreseen. For illustration purposes only, three second trenches 220 are depicted in FIG. 2; however, more or less trenches 220 may be present. For illustration purposes only, the three second trenches 220 are depicted in FIG. 2 as being formed in the left-most STI 140b, middle STI 140b and right-most STI 140b; however, such a configuration may be altered to utilize any combination of STIs 140b. Second trench(es) 220 is/are formed between adjacent fins 120 and extend below top surface 142 of STIs 140b and below top surface 122 of fins 120.

FIG. 3 illustrates isolation pillar formation by filling first and second trenches 210, 220 with an isolation fill such that the filling of first trench(es) 210 forms first isolation pillar(s) 310 in a gate region of structure 100 (cross-section "a") and the filling of second trench(es) 220 forms second isolation pillar(s) 320 in a TS region of structure 100 (cross-section "b"). First and second isolation pillars 310, 320 extend below top surface 142 of STIs 140 and continue to extend below top surface 122 of fins 120. The isolation fill used to fill trenches 210, 200 can be composed of any isolation material or a combination of isolation materials, such as, but not limited to, SiN and $SiO_2$.

FIG. 4 illustrates a fin and pillar reveal stage of the methods of the disclosure. More specifically, FIG. 4 depicts the removal of a portion (upper portion) of each STI 140 and hardmask 150 (on top of fins 120). The noted removal reveals a top portion 120a of fins 120 as well as a top portion 310a of first isolation pillar 310 and a top portion 320a of second isolation pillar 320. Hardmask 150 and STI 140 removal can be performed by any now known or later developed removal technique appropriate to the type of hardmask 150 and the type of STI 140, such as etching.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

FIG. 5 illustrates forming a dummy gate 510 over top portions 120a of fins 120 and top portions 310a of first isolation pillars 310 in a gate region of structure 100 (cross-section "a"). Dummy gate 510 can be formed by depositing a dummy gate material over top portions 120a of fins 120 and top portions 310a of first isolation pillars 310. "Depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. The dummy gate material can be, for example, polycrystalline silicon, amorphous silicon or microcrystal silicon. It is noted here that cross-section "b" of FIG. 5, i.e., the TS region, remains unchanged from FIG. 4 as FIG. 5 is drawn toward illustrating dummy gate formation in the gate region.

FIG. 6 illustrates a source/drain formation stage of the methods of the disclosure. More specifically, source/drain (S/D) epitaxial regions 620 are formed on top portions 120a of fins 120 in the TS region of structure 100. The S/D epitaxial regions 620 as depicted in FIG. 6 are shown as diamond junctions, but are not necessarily required to be diamond junctions, other shapes and configurations are possible. In the instance of diamond junctions, the methods of the disclosure include epitaxially growing a diamond junction 620 on top portions 120a of fins 120 in the TS region. The terms "epitaxial growth" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth processes may be selective to forming on semiconductor surfaces, and may not deposit material on dielectric surfaces, such as silicon dioxide or silicon nitride surfaces. It is noted here that cross-section "a" of FIG. 6, i.e., the gate region, remains unchanged from FIG. 5 as FIG. 6 is drawn toward illustrating S/D formation in the TS region.

As can also be seen in FIG. 6, second isolation pillars 320 separate each set of two diamond junctions 620 flanking an individual pillar 320. Thus, such adjacent diamond junctions 620 are not merged (remain separated), which in turn provides improved device performance compared to those devices that suffer from epi merge.

FIG. 7 illustrates the result of performing a metal gate replacement process on dummy gate 510 in the gate region of structure 100 (cross-section "a") and masking of the TS region (cross-section "b"). More specifically, a mask 720 is formed over the TS region (cross-section "b"), i.e., over top surfaces of diamond junctions 620 and STIs 140 as well as side and top surfaces of second isolation pillars 320. Common masking materials are photoresist (resist) and nitride. Nitride is usually considered to be a "hard mask." After forming mask 720 in the TS region, dummy gate 510 in the gate region is removed. Dummy gate 510 can be removed by any now known or later developed removal technique appropriate to the type of material used for the dummy gate, such as etching (described above). After removing dummy gate 510, a metal gate 710 is formed in place of dummy gate 510. In other words, metal gate 710 is formed over top portions 120a of fins 120 and top portions 310a of first isolation pillars 310 in a gate region of structure 100 (cross-section "a"). Metal gate 710 can be composed of any suitable metal gate material, including a "high-k" gate material such as, but not limited to, metal oxides such as tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4=1 (1 being the total relative mole quantity).

FIG. 8 illustrates recessing a top surface 710a (see FIG. 7) of metal gate 710. The recessing can be performed such that a recessed top surface 810a of metal gate 710 is approximately coplanar with a top surface 312 of first isolation pillars 310 in the gate region (cross-section "a"). Such recessing can be performed by now known or later developed planarization techniques. Planarization refers to various processes that make a surface more planar (that is, more flat and/or smooth). Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This removes material and tends to even out any "topography," making the wafer flat and planar. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

FIG. 8 also depicts forming a cap 820 over recessed top surface 810a of metal gate 710 and top surface 310a of first isolation pillars 310 in the gate region (cross-section "a"). Cap 820 can be formed by depositing a cap material composed of, for example, one or more of $Si_3N_4$, SiBCN, SiNC, SiN, SiCO, $SiO_2$ and SiNOC. It is noted here that cross-section "b" of FIG. 8, i.e., the TS region, remains unchanged from FIG. 7 as FIG. 8 is drawn toward illustrating metal gate recessing and capping in the gate region.

FIG. 9 illustrates a TS region mask removal and metal layer formation stage of the methods of the disclosure. More specifically, FIG. 9 depicts the result of removing mask 720 from the TS region followed by forming a metal layer 920 in the place of mask 720 (cross-section "b"). Metal layer 920 can have a top surface 920a approximately coplanar with a top surface 322 of second isolation pillars 320. Metal layer 920 can be composed of, for example, $SiO_2$. It is noted here that cross-section "a" of FIG. 9, i.e., the gate region, remains unchanged from FIG. 8 as FIG. 9 is drawn toward illustrating mask removal and metal layer formation in the TS region.

As can be seen in FIG. 9, first isolation pillars 310 have a height 910 from topmost surface 312 to a bottom-most surface 314. Topmost surface 312 is approximately planar with a bottom surface 820b of cap 820. Bottom-most surface 314 is below top portions 120a of fins 120 and below upper surfaces 142 of STIs 140. Height 910 of first isolation pillars 310 is about 60 nanometers to about 70 nanometers. Second isolation pillars 320 have a height 930 from top surface 322 to a bottom-most surface 324. As noted above, top surface 322 is approximately planar with top surface 920a of metal layer 920. Bottom-most surface 324 is below top portions 120a of fins 120 and below upper surfaces 142 of STIs 140. Height 930 of second isolation pillars 320 is about 60 nanometers to about 70 nanometers. Height 930 of second isolation pillars 320 is preferably the same as height 910 of first isolation pillars 310.

As described above in step-by-step detail, the methods of the disclosure form the isolation pillars before the dummy gate formation stage. Such early stage isolation pillar formation allows for reduced gate budgets (approximately 28 nm smaller gate budget) and consequently lower aspect ratios as compared to conventional methods utilizing isolation pillars formed after the dummy gate formation stage. The reduced gate budget (gate height loss) is the result of the disclosed methods' elimination of an approximate 13 nanometer gate height loss during the conventional step of inter-layer dielectric (ILD) recess and an approximate 15 nanometer gate height loss during the conventional step of TS cut/fill and CMP. Furthermore, and as noted above, the methods of the disclosure provide for epi separation via the isolation pillars and thus also provide improved device performance as compared to those devices suffering from epi merge.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate+/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. A method of forming isolation pillars for a gate structure, the method comprising:
   providing a preliminary structure, the preliminary structure including a substrate having a plurality of fins thereon, a shallow trench isolation (STI) formed between adjacent fins, an upper surface of the STIs extending higher than an upper surface of the plurality of fins, and a hardmask over the upper surface of the plurality of fins and between adjacent STIs;
   forming a first trench in a first selected STI in a gate region of the plurality of fins and a second trench in a second selected STI in a trench silicide (TS) region of the plurality of fins, the first trench being formed between adjacent fins in the gate region and the second trench being formed between adjacent fins in the TS region; and
   filling the first and second trenches with an isolation fill, the filling of the first trench forming a first isolation pillar in the gate region and the filling of the second trench forming a second isolation pillar in the TS region, the first and second isolation pillars extending below the upper surface of the STIs.

2. The method of claim 1, further comprising planarizing the first and second isolation pillars until a top surface of the first and second isolation pillars is approximately planar with a top surface of the hardmask.

3. The method of claim 1, wherein the plurality of fins contain an isolation layer therein.

4. The method of claim 1, further comprising removing the hardmask and a portion of each STI, the removing revealing a top portion of the plurality of fins and a top portion of the first and second isolation pillars.

5. The method of claim 4, further comprising forming a dummy gate over the top portion of the plurality of fins in the gate region and over a top portion of the first isolation pillar.

6. The method of claim 5, further comprising forming source/drain epitaxial regions in the TS region of the plurality of fins.

7. The method of claim 6, further comprising performing a metal gate replacement process on the dummy gate.

8. The method of claim 6, wherein the forming of the source/drain epitaxial regions comprises:
epitaxially growing a diamond junction on the top portion of the plurality of fins in the TS region.

9. The method of claim 8, wherein adjacent diamond junctions are not merged.

10. The method of claim 7, wherein the performing of the metal gate replacement process comprises:
forming a mask over the TS region;
removing the dummy gate; and
forming a gate dielectric in place of the dummy gate, wherein the gate dielectric comprises a material selected from the group consisting of:
tantalum oxide ($Ta_2O_5$), barium titanium oxide ($BaTiO_3$), hafnium oxide ($HfO_2$), zirconium oxide ($ZrO_2$), aluminum oxide ($Al_2O_3$), hafnium silicate oxide ($Hf_{A1}Si_{A2}O_{A3}$) and hafnium silicate oxynitride ($Hf_{A1}Si_{A2}O_{A3}N_{A4}$), where A1, A2, A3, and A4 represent relative proportions, each greater than or equal to zero and A1+A2+A3+A4=1, wherein 1 is the total relative mole quantity.

11. The method of claim 10, further comprising:
recessing a top surface of the gate dielectric; and
forming a cap over the recessed gate dielectric.

12. The method of claim 11, further comprising:
removing the mask over the TS region;
forming a silicon dioxide ($SiO_2$) layer over the unmasked TS region; and
planarizing the cap and the $SiO_2$ layer.

13. The method of claim 11, wherein the first isolation pillar has a height from a topmost surface to a bottommost surface of about 60 nanometers (nm) to about 70 nanometers (nm), the topmost surface being approximately planar with a bottom surface of the cap and the bottommost surface being below the top portion of the plurality of fins and below the upper surface of the STIs.

14. The method of claim 12, wherein the second isolation pillar has a height from a topmost surface to a bottommost surface of about 60 nanometers (nm) to about 70 nanometers (nm), the topmost surface being approximately planar with a top surface of the $SiO_2$ layer and the bottommost surface being below the top portion of the plurality of fins and below the upper surface of the STIs.

15. An isolation pillar containing a gate structure comprising:
a structure comprising a substrate having a plurality of fins thereon, a shallow trench isolation (STI) disposed between adjacent fins, an upper surface of the STIs being below an upper surface of the plurality of fins;
a gate dielectric disposed over a top portion of the plurality of fins and the upper surface of the STIs in a gate region of the structure, wherein the gate dielectric comprises a material selected from the group consisting of: tantalum oxide ($Ta_2O_5$), barium titanium oxide ($BaTiO_3$), hafnium oxide ($HfO_2$), zirconium oxide ($ZrO_2$), aluminum oxide ($Al_2O_3$), hafnium silicate oxide ($Hf_{A1}Si_{A2}O_{A3}$) and hafnium silicate oxynitride ($Hf_{A1}Si_{A2}O_{A3}N_{A4}$), where A1, A2, A3, and A4 represent relative proportions, each greater than or equal to zero and A1+A2+A3+A4=1, wherein 1 is the total relative mole quantity;
a first isolation pillar in the gate region extending through the gate dielectric and into a first selected STI in the gate region;
an epitaxial diamond junction on the top portion of the plurality of fins in a trench silicide (TS) region of the structure;
a silicon dioxide ($SiO_2$) layer disposed over a top surface of the diamond junctions and the upper surface of the STIs in the TS region; and
a second isolation pillar in the TS region extending through the $SiO_2$ layer, between adjacent diamond junctions and into a second selected STI in the TS region, wherein the second isolation pillar has a height from a topmost surface to a bottommost surface of about 60 nanometers (nm) to about 70 nanometers (nm), the topmost surface being approximately planar with a top surface of the $SiO_2$ layer and the bottommost surface being below the top portion of the plurality of fins and below the upper surface of the STIs.

16. The structure of claim 15, wherein the plurality of fins contain an isolation layer therein.

17. The structure of claim 15, further comprising a cap over the gate dielectric.

18. The structure of claim 17, wherein the first isolation pillar has a height from a topmost surface to a bottommost surface of about 60 nanometers (nm) to about 70 nanometers (nm), the topmost surface being approximately planar with a bottom surface of the cap and the bottommost surface being below the top portion of the plurality of fins and below the upper surface of the STIs.

19. The structure of claim 15, wherein adjacent diamond junctions are not merged.

* * * * *